(12) United States Patent
Von Werne

(10) Patent No.: US 8,411,231 B2
(45) Date of Patent: Apr. 2, 2013

(54) DISTORTION TOLERANT PIXEL DESIGN

(75) Inventor: Tim Von Werne, London (GB)

(73) Assignee: Plastic Logic Limited, Cambridge (GB)

( * ) Notice: Subject to any disclaimer, the term of this patent is extended or adjusted under 35 U.S.C. 154(b) by 600 days.

(21) Appl. No.: 12/519,144

(22) PCT Filed: Dec. 13, 2007

(86) PCT No.: PCT/GB2007/050757
§ 371 (c)(1),
(2), (4) Date: Jan. 11, 2010

(87) PCT Pub. No.: WO2008/072017
PCT Pub. Date: Jun. 19, 2008

(65) Prior Publication Data
US 2010/0134727 A1    Jun. 3, 2010

(30) Foreign Application Priority Data

Dec. 14, 2006    (GB) .................................... 0624994.0
Jul. 19, 2007    (GB) .................................... 0714014.8

(51) Int. Cl.
*G02F 1/1335*    (2006.01)
(52) U.S. Cl. .......... 349/106; 349/43; 349/107; 349/108; 349/158
(58) Field of Classification Search .................... 349/43, 349/106–108, 158
See application file for complete search history.

(56) References Cited

U.S. PATENT DOCUMENTS

| 5,936,259 A * | 8/1999 | Katz et al. ........................ 257/40 |
| 2004/0023425 A1* | 2/2004 | Chen et al. ....................... 438/27 |
| 2005/0237474 A1* | 10/2005 | Nishiki ......................... 349/187 |

FOREIGN PATENT DOCUMENTS

| KR | 2006/0061574 A1 | 6/2006 |
| WO | WO 2005/050754 A1 | 6/2005 |
| WO | WO 2006/059162 A1 | 6/2006 |

OTHER PUBLICATIONS

International Preliminary Report on Patentability and Written Opinion for International Application No. PCT/GB2007/050757 dated Jun. 16, 2009.

* cited by examiner

*Primary Examiner* — Phu Vu
(74) *Attorney, Agent, or Firm* — Knobbe Martens Olson & Bear, LLP

(57) ABSTRACT

A pixel architecture for compensating for distortions in a flexible substrate of a flexible display, including: a first layer including a thin film transistor (TFT) on a flexible substrate; a second layer disposed above said first layer including a pixel electrode coupled to said TFT for receiving a signal from said TFT; and a third layer including a color filter for filtering light displayed by said pixel, wherein said third layer is aligned to said second layer such that said color filter is substantially aligned to said pixel electrode, said alignment compensating for distortions in said first layer caused by distortions in said flexible substrate.

31 Claims, 7 Drawing Sheets

DISTORTION TOLERANT PIXEL DESIGN

CROSS-REFERENCE TO RELATED APPLICATIONS

This application is the U.S. National Phase under 35 U.S.C. §371 of International Application No. PCT/GB2007/050757, filed Dec. 13, 2007, designating the United States and published in English on Jun. 19, 2008, as WO 2008/072017, which claims priority to United Kingdom Application No. 0624994.0, filed Dec. 14, 2006 and United Kingdom Application No. 0714014.8, filed Jul. 19, 2007.

FIELD OF THE INVENTION

The present invention relates to a pixel architecture for compensating for distortions in a flexible substrate and methods of manufacturing displays comprising said pixel architectures.

DESCRIPTION OF RELATED ART

Many display technologies such as liquid crystal displays (LCDs) and electrophoretic displays rely on the use of colour filters to display full colour images. Also some emissive display technologies, for example, organic or inorganic LEDs based on white electroluminescence rely on the use of colour filters to display full colour images. In general, the display comprises an array of pixels defined by a pattern of pixel electrodes through which electrical signals are applied to the display medium. In a passive matrix display each pixel electrode is connected directly to an interconnect running across the display. In an active matrix display a thin film transistor (TFT) is used to control the voltage signal on the pixel electrode. In a full colour display each pixel consists of three or more sub-pixels each responsible for displaying a specific elementary colour, for example, red, green or blue. In order to achieve a good front-of-screen performance it is necessary to align the pattern of colour filters with respect to the pattern of pixel electrodes.

Current technology relies on the fabrication of a pixilated colour filter, which is carefully aligned to the pixels on a backplane. Once the colour filters and the pixels are aligned a process of laminating the colour filters to the layered substrate then takes place. However, this method of alignment of the colour filter to underlying pixels is not possible for a device that incorporates a flexible substrate. This is due to the level of distortion that is associated with a flexible substrate that occurs during the various processing stages of the substrate. In order to achieve optimal colour imaging and maintain high aperture ratio, the colour filter must be very accurately aligned to the pixel pattern on the substrate.

In WO2004/100117, an array of pixels are disclosed, which are arranged according in an irregular array within electronic imaging devices. In order to overcome a liasing effect, the pixels are arranged in patterns that do not easily interact with different patterns within an image.

SUMMARY OF THE INVENTION

We will describe embodiments of the present invention that address the problem of aligning a pixilated colour filter to a top pixel electrode pattern on a substrate that has been distorted during preceding processing steps. The disclosed method incorporates a distortion tolerant pixel design which allows the intentional misalignment of the top pixel electrode with respect to the source and drain patterned electrodes by defining a non-distortional top pixel pattern.

The present invention provides a pixel architecture for compensating for distortions in a flexible substrate of a flexible display, comprising: a first layer comprising a thin film transistor (TFT) on a flexible substrate; a second layer disposed above said first layer comprising a pixel electrode coupled to said TFT for receiving a signal from said TFT; and a third layer comprising a colour filter for filtering light displayed by said pixel, wherein said third layer is aligned to said second layer such that said colour filter is substantially aligned to said pixel electrode, said alignment compensating for distortions in said first layer caused by distortions in said flexible substrate.

The pixel architecture provides a pixel that compensates for distortions in a flexible substrate by allowing misalignment of the top pixel electrode with respect to underlying source-drain patterned electrodes, but aligning the colour filter to the pixel electrode. This enables array of such pixels to provide an image of higher quality than would otherwise be possible, as the filters are aligned with the electrodes.

In embodiments of the present invention, it is preferable that said pixel electrode is shaped to enable said pixel electrode to be displaced laterally with respect to said TFT during manufacture of said pixel, said displacement being caused by distortions in said flexible substrate. Preferably, said coupling between said electrode and TFT comprises a via connector between said electrode and said TFT.

In embodiments, a maximum lateral displacement between said electrode and said TFT is less than half of a difference between a dimension of said electrode and a diameter of said via connector.

Preferably, the pixel architecture further comprises a display medium disposed between said second and third layers, said display medium being responsive to signals on said pixel electrode. In embodiments, said display medium comprises an electrophoretic display medium or a liquid crystal medium.

In embodiments, the substrate of the pixel architecture comprises polyethyleneterephtalate (PET) or polyethylenenaphtalene (PEN). In embodiments, said TFT comprises an organic semiconductor, which may be a solution-processed organic semiconductor.

The present invention also provides a flexible display comprising: a first layer comprising a plurality of thin film transistors (TFTs) on a flexible substrate; a second layer disposed above said first layer comprising a plurality of pixel electrodes, each of said pixel electrodes being coupled to a respective TFT for receiving a signal from said respective TFT; a display medium for displaying an image, said medium being disposed on said second layer, and said display medium being responsive to signals on said pixel electrodes; and a third layer comprising a plurality of colour filters for filtering an image displayed on said display, wherein said third layer is aligned to said second layer such that each of said colour filters is substantially aligned to a respective pixel electrode, said alignment compensating for distortions in said first layer caused by distortions in said flexible substrate, and wherein at least some of said pixel electrodes and colour filters are misaligned with said TFT.

By allowing misalignment of the top pixel with respect to underlying source-drain patterned electrodes, but aligning the colour filter to the pixel electrode, the display may provide an image of higher quality than would otherwise be possible. The misalignment compensates for distortions in the underlying flexible substrate.

In embodiments of the present invention, each of said pixel electrodes is shaped to enable said pixel electrodes to be displaced laterally with respect to said TFTs during manufacture of said display, said displacement being caused by distortions in said flexible substrate.

In embodiments, a lateral position of said via connector relative to a said pixel electrode varies by at least 5 µm, 10 µm or 20 µm across said array.

Preferably, a maximum lateral displacement between a said electrode and a said TFT is less than half of a difference between a dimension of said electrode and a diameter of said via connector.

Preferably, the display medium of the flexible display comprises an electrophoretic display medium or a liquid crystal display medium. Preferably, the substrate of the flexible display comprises polyethyleneterephtalate (PET) or polyethylenenaphtalene (PEN). Preferably, said TFT of said flexible display comprises an organic semiconductor, which may be a solution-processed organic semiconductor.

The present invention also provides a method of compensating for distortion when manufacturing a pixel for a display, the pixel comprising: a first layer comprising a thin film transistor (TFT) on a flexible substrate; a second layer disposed above said first layer comprising a pixel electrode coupled to said TFT for receiving a signal from said TFT; and a third layer comprising a colour filter for filtering light displayed by said pixel, the method comprising: aligning said filter with said electrode and connecting said electrode to said TFT so as to allow relative misalignment of said electrode and said TFT.

The above method allows misalignment of the top pixel electrode with respect to underlying source-drain patterned electrodes, but aligning the colour filter to the pixel electrode. Using such a method, a display comprising such pixels may be capable of displaying an image having a higher quality than may presently be possible.

The present invention also provides a method of manufacturing a flexible display comprising: depositing a first layer comprising a plurality of thin film transistors (TFTs) on a flexible substrate; depositing a second layer above said first layer, said second layer comprising a plurality of pixel electrodes, each of said pixel electrodes being connected to a respective TFT via a respective via connector between said first and second layers; depositing a display medium for displaying an image on said second layer, said display medium being responsive to signals on said pixel electrode; aligning a third layer to said second layer, said third layer comprising a plurality of colour filters for filtering an image displayed on said display medium; and depositing said third layer on said second layer, wherein said third layer is aligned to said second layer such that each of said colour filters is substantially aligned to a respective pixel electrode, and wherein said alignment compensates for distortions in said first layer caused by distortions in said flexible substrate.

By allowing misalignment of the top pixel with respect to underlying source-drain patterned electrodes, but aligning the colour filter to the pixel electrode, a display manufactured using this method may provide an image of higher quality than would otherwise be possible. The misalignment compensates for distortions in the underlying flexible substrate.

In embodiments, depositing a second layer in the method of manufacturing a flexible display comprises depositing a conductive material on said first layer; and patterning said conductive material to define said plurality of pixel electrodes, and wherein said pixel electrodes are shaped to enable said pixel electrodes and said TFTs to be displaced laterally from one another, said displacement being caused by distortions in said flexible substrate. Preferably, a maximum lateral displacement is less than half of a difference between a dimension of said electrode and a diameter of said via connector.

Preferably, depositing a third layer comprises: depositing a filtering material on said display medium; and patterning said filtering material to define said plurality of colour filters, each of said colour filters being substantially aligned to a respective pixel electrode.

Preferably, the step of patterning comprises performing a step and repeat exposure procedure comprising exposing a first area of said layer to a light source to define a pattern, and translating said substrate from a first position at which said first area is exposable to a second position at which a second area of said layer is exposable. Preferably, a distance between said first position and said second position is an integer multiple of a pitch of said pixel electrodes. Furthermore, a distance between said first and said second position may be selected to correct for distortion in said first layer caused by distortion in said flexible substrate.

In embodiments, said light source is a laser and wherein said material is laser ablated. Alternatively, said exposure comprises a photolithographic process. Alternatively, said material is deposited and patterned substantially at the same time by printing said material in a pattern onto said layer.

Preferably, the step of aligning comprises aligning features in said third layer to corresponding features in said second layer. Preferably, said features include layer markers disposed in one or more corners of said layer.

In embodiments, aligning comprises measuring and storing positioning data representing a position of said display during said deposition of said second layer; and controlling a position of said display during said depositing of said third layer using said data.

In embodiments of the method of manufacturing a flexible display, said display medium comprises an electrophoretic display medium or a liquid crystal medium. Preferably, said substrate comprises polyethyleneterephtalate (PET) or polyethylenenaphtalene (PEN). Preferably, said TFT comprises an organic semiconductor, which may be a solution-processed organic semiconductor.

The present invention also provides a pixel for a flexible display, comprising: a first layer comprising a thin film transistor (TFT) on a flexible substrate; and a second layer disposed above said first layer comprising a pixel electrode coupled to said TFT for receiving a signal from said TFT, wherein said pixel electrode is shaped to enable said pixel electrode to be displaced laterally with respect to said TFT during manufacture of said pixel, said displacement being caused by distortions in said flexible substrate.

Preferably, said coupling between said electrode and TFT comprises a via connector between said pixel electrode and said TFT. Preferably, a maximum lateral displacement between said electrode and said TFT is less than half of a difference between a dimension of said electrode and a diameter of said via connector.

In embodiments, the pixel for a flexible display further comprises: a third layer comprising a colour filter for filtering light displayed by said pixel, wherein said third layer is aligned to said second layer such that said colour filter is substantially aligned to said pixel electrode, and wherein said alignment compensates for distortions in said first layer caused by distortions in said flexible substrate.

Preferably, a display medium is disposed between said second and third layers, said display medium being responsive to signals on said pixel electrode. Preferably, said display medium comprises an electrophoretic display medium or a liquid crystal medium. Preferably, said substrate comprises polyethyleneterephtalate (PET) or polyethylenenaphtalene (PEN). Preferably, said TFT comprises an organic semiconductor, which may be a solution-processed organic semiconductor.

According to another embodiment of the present invention, an architecture is disclosed for a full-colour active matrix pixilated display on a flexible substrate comprising an array of TFTs on a first level, an array of pixel electrodes on a second level each connected to an electrode of a TFT by a via-hole interconnection and an array of colour filters on a third level, wherein the position of the via hole interconnection in each sub-pixel with respect to the corresponding TFT, and/or pixel electrode varies across the array due to distortion in the underlying substrate. The invention allows forming the pixel electrodes and colour filters as periodic or quasiperiodic arrays with high accuracy and high relative alignment, while ensuring that each TFT on the flexible substrate is connected to the correct sub-pixel electrode.

The present invention addresses the problem of visual image artifacts that arise when patterning colour filter arrays on flexible active matrix substrates. When manufacturing the array of TFTs on a flexible active matrix substrate it is preferable to align accurately the gate electrodes of the TFT with respect to the source-drain electrodes across the array in order to avoid variations in the parasitic capacitance between source-drain and gate electrodes across the array. This requires compensating for distortions of the substrate when patterning the gate electrode array on top of an underlying source-drain array (top-gate configuration) and source-drain array on top of an underlying gate array (bottom-gate configuration), respectively. These distortions might occur in between the steps of processing the gate and source-drain electrode layer, for example as a result of temperature variations, mechanical handling of the substrate or exposure to chemical agents, such as water vapour.

As a result of the substrate distortion the position of the TFTs is not periodic across the array. If the array of pixel electrodes and colour filters were aligned to be at a fixed position with respect to each of the TFTs, as is desirable in conventional configuration in which the pixel electrode is defined on the same level as the source-drain and gate electrodes, respectively, this would lead to visual image artefacts, since the human eye is very sensitive to spatial variations in the pitch of a quasi-periodic array. Also, any misalignment of the pixel electrode and the colour filter pixel can lead to image artefacts such as colour filters spatially overlapping with pixel electrodes belonging to neighbouring pixels/sub-pixels.

The architecture according to the present invention addresses this problem by allowing the position of the pixel TFT with respect to the pixel electrode and colour filter, to vary respectively. By fanning the pixel electrode on a different level of the device than the TFTs the present invention allows maintaining accurate alignment of the source-drain and gate electrodes of the TFT with respect to each other in the presence of substrate distortions while forming the pixel electrodes and colour filter pixels on a periodic or quasi-periodic array with high accuracy and in accurate relative alignment.

According to another embodiment of the present invention a method is disclosed for fabricating a full-colour active matrix pixilated display on a flexible substrate comprising an array of TFTs on a first level, an array of pixel electrodes on a second level each connected to an electrode of a TFT by a via-hole interconnection and an array of colour filters on a third level wherein the position of the via hole interconnection in each sub-pixel with respect to the corresponding TFT, and/or pixel electrode varies across the array due to distortion in the underlying substrate.

According to a preferred embodiment of this aspect of the invention the technique for patterning the array of pixel electrodes and colour filter pixels is step-and-repeat exposure of the substrate to a shaped beam of light or laser radiation. Patterning is achieved either by the process of laser ablation or by light-induced chemical or physical changes of a material on the substrate.

If the maximum distortion of the array of TFTs is smaller than a critical distortion $x_c$, which denotes the maximum allowable distortion for which each via-hole interconnection remains connected to the correct sub-pixel electrode (the array of pixel electrodes being periodic across the entire substrate), the step-and-repeat exposure preferably involves exposing the substrate to a periodic pattern of light with a defined pixel pitch and translating the substrate between subsequent exposures by a fixed translation distance that is an integer multiple of said pixel pitch. Preferably, for the patterning of the pixel electrodes and of the colour filter pixels the same pixel pitch and the same fixed translation distance are used. The pattern of colour filter pixels is preferably aligned with respect to the pattern of pixel electrodes by using a set of global alignment marks defined on the level of the pixel electrodes.

If the maximum distortion of the array of TFTs are larger than a critical distortion $x_c$, which denotes the maximum allowable distortion of the TFT array for which each via-hole interconnection remains connected to the correct sub-pixel electrode (the array of pixel electrodes being periodic across the entire substrate), the step-and-repeat exposure preferably involves exposing the substrate to a pattern of light and translating the substrate between subsequent exposures by a variable distance that is selected to ensure that in each of the exposed areas each via-hole interconnection would remain connected to the correct sub-pixel electrode.

According to one embodiment of this aspect of the invention the pattern of each step-and-repeat light exposure is periodic and the correction for the distortion of the array of TFTs is achieved solely by varying the translation distance by which the substrate is translated in between subsequent exposures. Preferably, for the patterning of the pixel electrodes and of the colour filter pixels the same pixel pitch and the same set of translation distances are used. The pattern of colour filter pixels is preferably aligned with respect to the pattern of pixel electrodes by using a set of global alignment marks defined on the level of the pixel electrodes.

According to another embodiment of this aspect of the invention the pattern of each step-and-repeat light exposure is non-periodic and the correction for the distortion of the array of TFTs is achieved by varying the distance by which the substrate is translated in between subsequent exposures, and by selecting a set of variable pixel distances in each step-and-repeat light exposure pattern in such a way that visual image artifacts at the boundaries between subsequent light-exposures are minimized. Preferably, for the patterning of the pixel electrodes and of the colour filter pixels the same set of pixel distances and translation distances are used. The pattern of colour filter pixels is preferably aligned with respect to the pattern of pixel electrodes by using a set of global alignment marks defined on the level of the pixel electrodes.

BRIEF DESCRIPTION OF THE DRAWINGS

To help understanding of the invention, a specific embodiment thereof will now be described by way of example and with reference to the accompanying drawings, in which.

DETAILED DESCRIPTION OF PREFERRED EMBODIMENTS

Example

A Method of Processing Colour Filters on a Flexible Display Device by Overcoming Substrate Distortion A preferred embodiment is disclosed according to the present invention, wherein a flexible electronic device is formed by a process in which a colour filter array is deposited over a layer of display media using a method of alignment to an underlying array of top pixel electrodes. This process of aligning the above said colour filter to the positioning of the top pixel electrode allows compensating for the distortion correction of a distorted flexible substrate.

Figure 1:
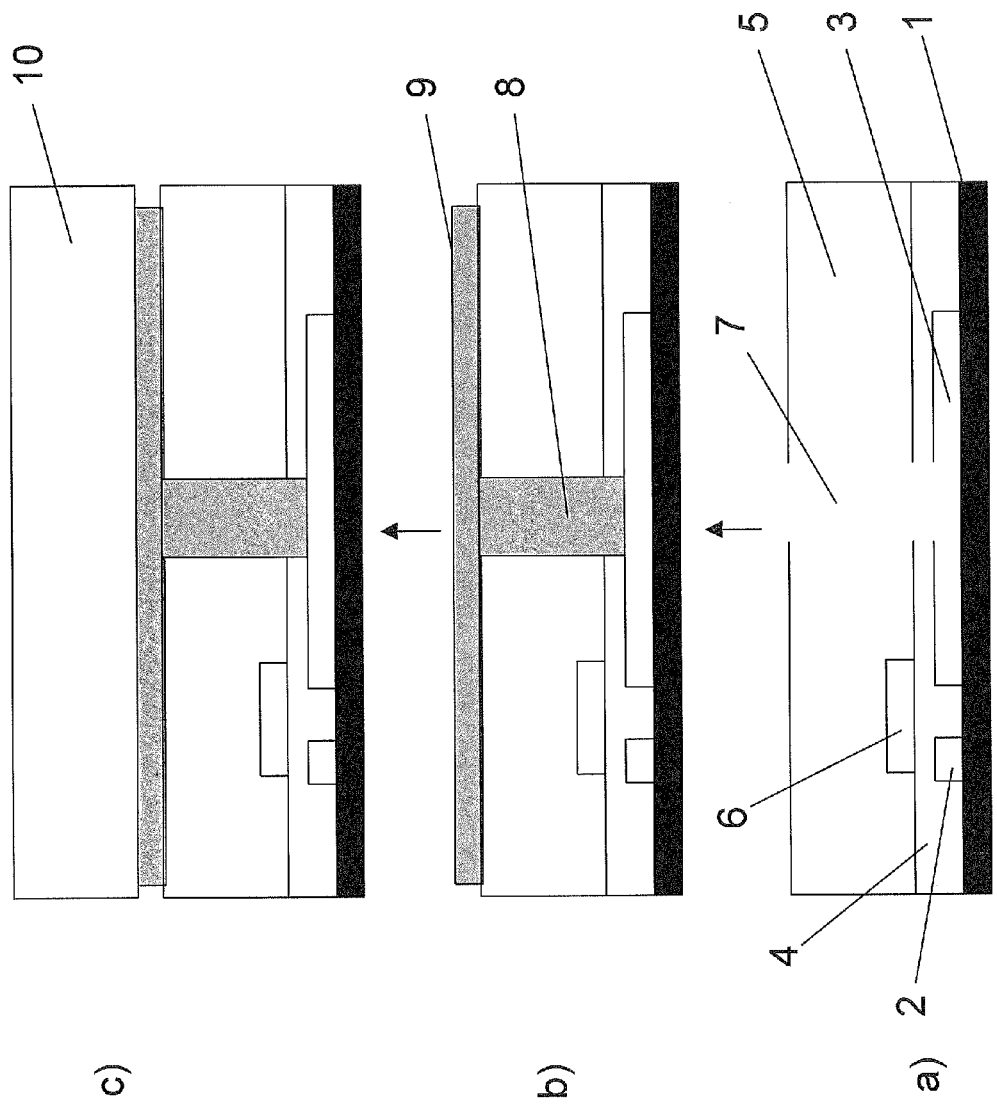
FIG. 1 shows the process of forming a monochrome display incorporating a backplane with a pixel electrode array and display medium.

According to a main embodiment of the present invention, FIG. 1 shows the formation of the various layers of a multilayered substrate stack. Conductive material is deposited and patterned on a substrate 1 to form source and drain electrodes 2, 3. The substrate may be either glass or a polymer film, but preferably a plastic substrate such as polyethyleneterephtalate (PET) or polyethylenenaphtalene (PEN) is used. The patterned conductive layer 2, 3 comprises a conducting polymer, such as PEDOT, or a metallic material, such as gold or silver. It may be deposited and patterned by techniques, such as, but not limited to additive solution processing, for example, spin, dip, blade, bar, slot-die, or spray coating, inkjet, gravure, offset or screen printing, or vacuum-base deposition such as evaporation or sputtering followed by subtractive patterning, such as photolithography and laser ablation.

Once the conductive layer has been patterned to form the source and drain electrodes, a layer of semiconducting material 4 may then be deposited over the substrate and patterned electrodes. The semiconducting layer may be either an organic or an inorganic material, but preferably consist of a conjugated organic semiconductor such as, but not limited to, pentacene, polyarylamine, polyfluorene or polythiophene derivatives. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, blade coating or dip coating, curtain coating, meniscus coating, spray coating, or extrusion coating.

A layer of gate dielectric material 5 is then deposited onto the layered substrate. Any organic or inorganic dielectric may be used, however in combination with a semiconducting polymer polymer dielectrics such as such as polyisobutylene, polyvinylphenol, polymethylmethacrylate (PMMA) or polystyrene are preferred. The dielectric material may be deposited in the form of a continuous layer, by techniques such as, but not limited to, spray or blade coating. However, preferably, the technique of spray coating is used.

The deposition of the dielectric layer is then followed by the deposition and patterning of a gate electrode and interconnect lines 6. The material of the gate electrode may be a patterned thin film of inorganic metals such as gold or a pattern of printable inorganic nanoparticles of silver or gold, or a conducting polymer, such as polyethylenedioxythiophene doped with polystyrene sulfonic acid (PEDOT/PSS). The gate electrode is deposited using techniques such as sputtering or evaporation techniques or solution processing techniques such as, but not limited to, spin, dip, blade, bar, slot-die, gravure, offset or screen printing. Preferably, the gate electrode is deposited using the solution processing technique of ink jet printing. Alternatively, the gate electrode may be patterned by techniques such as photolithographic patterning (WO 99/10939) or laser ablation.

Other low-cost patterning techniques can also be used to pattern the gate electrode and interconnect lines, such as subtractive patterning by photolithography or laser ablation patterning. A particularly preferred patterning technique is selective laser ablation patterning (SLAP) (as explained in patent application number GB0513915.9). The technique of SLAP is a method of producing fine features of a device using short pulse lasers for the fabrication of thin film transistor (TFT) structures. This technique incorporating laser ablation uses a single shot per imaging area of a short pulse laser to pattern layers of metallic material on top of underlying layers in order to produce fine features of a TFT device. An example is the patterning of a gold gate electrode of a top-gate organic TFT with underlying gate dielectric, active semiconductor and conducting source-drain electrode layers. This technique may be performed without destroying or substantially degrading the performance of these sensitive elements, such as the semiconductor layer and the source-drain electrodes. This is due to the short pulse length allowing all of the energy of an ultra-short laser beam to enter the material and to be absorbed within the layer to be ablated which will result in the act of ablation before any substantial thermalization actually occurs, that can lead to degradation/ablation of underlying layer. This technique can be employed for patterning of metal electrodes and interconnects on the various levels of the device, in particular for patterning of the source-drain and gate electrodes, and the common electrode layer.

At least one further layer of dielectric material 5 is deposited on the substrate after the deposition of the gate electrode and interconnect and data lines. The dielectric material may be deposited from solution in the form of a continuous layer, by techniques such as, but not limited to, spin coating, ink-jet printing, spray-coating, roller coating spray or blade coating. The dielectric material may also be deposited using vapour phase deposition techniques like evaporation or chemical vapour deposition. The dielectric material is preferably deposited in such a way so that no degradation occurs to the underlying layers. A method to achieve this is disclosed in our previous patent application WO01/47043. In this, a method for forming a transistor was disclosed by depositing a first material from solution in a first solvent to form a first layer of the transistor; and subsequently whilst the first material remains soluble in the first solvent, forming a second layer of the transistor by depositing over the first material a second material from solution in a second solvent in which the first material is substantially insoluble. A suitable solution processable dielectric material that may be used as a second dielectric layer is polystyrene dissolved in xylene. In addition, parylene is an example of a dielectric material that may be deposited via chemical vapour phase deposition.

Then a via-hole interconnection 7 through the dielectric later 5 to the underlying drain electrode 3. Techniques for via hole opening 7 and via fabrication, and other selective connection formation techniques such as selective removal of layers, are described at pages 32 to 39 of WO 01/47043, with reference to FIGS. 12 to 15, which material is specifically incorporated by reference in this application.

A conductive material, such as a conducting polymer is deposited into the via hole to form an electrical connection between the underlying drain electrode and the top pixel, which is formed at the same time as filling the via hole 8, as is shown in FIG. 1*b*).

A top level pixel electrode is deposited (as shown in FIG. 1*b*) as a patterned film using a direct write printing technique such as inkjet printing of a conducting polymer. The pixel electrode is required to be electrically connected to the underlying drain electrode 3 of the TFT through a via hole interconnection 8 (see FIG. 1*b*).

A display medium 10 is then deposited and laminated over the underlying patterned conductive top pixel electrode layer as in shown in FIG. 1*c*). Preferably, an emissive (light-emitting) display or a reflective or transmissive display medium, such as an electrophoretic display medium or a reflective or transmissive LC medium is incorporated within the device structure and is located over the underlying back plane. The display medium is deposited directly and continuously over the flexible back plane substrate. Preferably, the display medium is a reflective or emissive display medium, since in this case the present architecture in which the pixel electrode is formed on a different level than the TFT allows achieving high aperture ratio irrespective of the size of the TFT. For example, in the case of a polymer light-emitting display medium the optically active polymers may be solution-coated or inkjet printed above the top pixel locations of an active or passive matrix followed by a transparent encapsulation layer. In the case of an electrophoretic display medium a film of electrophoretic ink deposited onto a top substrate of the flexible back plane.

Figure 2:
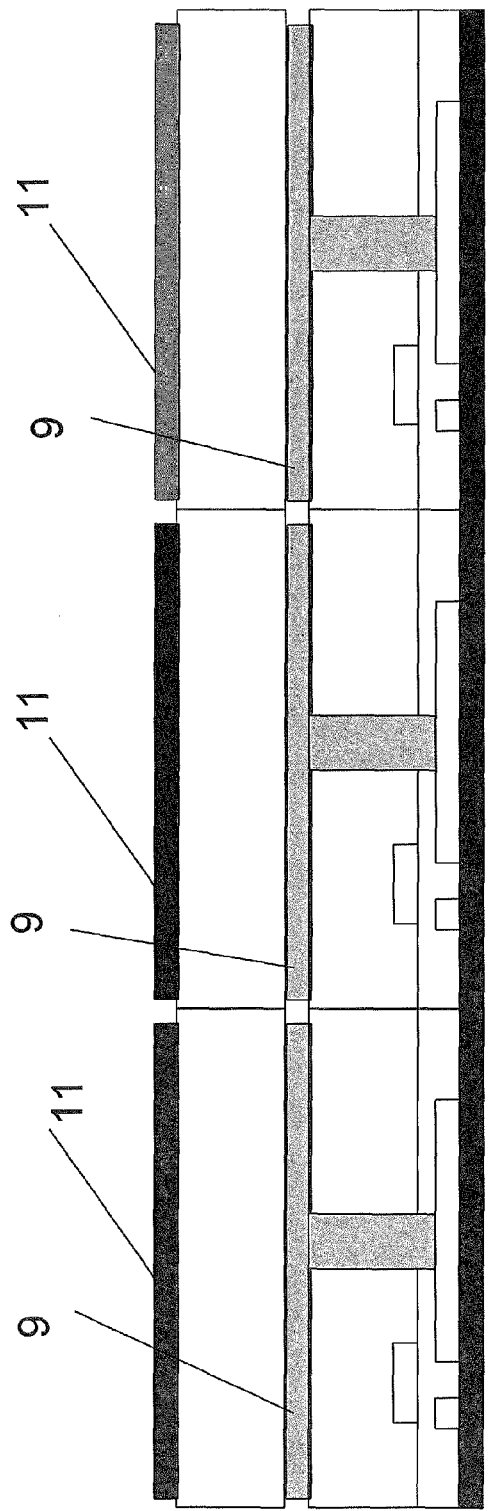
FIG. 2 illustrate a schematic diagram of a colour display incorporating a backplane with a pixel electrode array, a display medium and a pixilated colour filter on an undistorted substrate.

Finally, colour filters 11 are laminated on top of the underlying media display layer as is seen in FIG. 2. The colour filters may be deposited and patterned through solution processing techniques such as, but not limited to, spin-coating a negative photo-resist and then patterning the filters by photolithography and subsequent etching. Alternatively, the colour filter material may be deposited by direct-write techniques such as ink jet printing. If the substrate is a rigid substrate in which the pattern of pixel electrodes 9 is arranged on a regular pitch across the whole substrate, the colour filter array can be aligned accurately by using the same pitch pattern for the patterning of the colour filter. The layered device structure incorporating the colour filters according to the prior art can be seen in FIG. 2.

Figure 3:
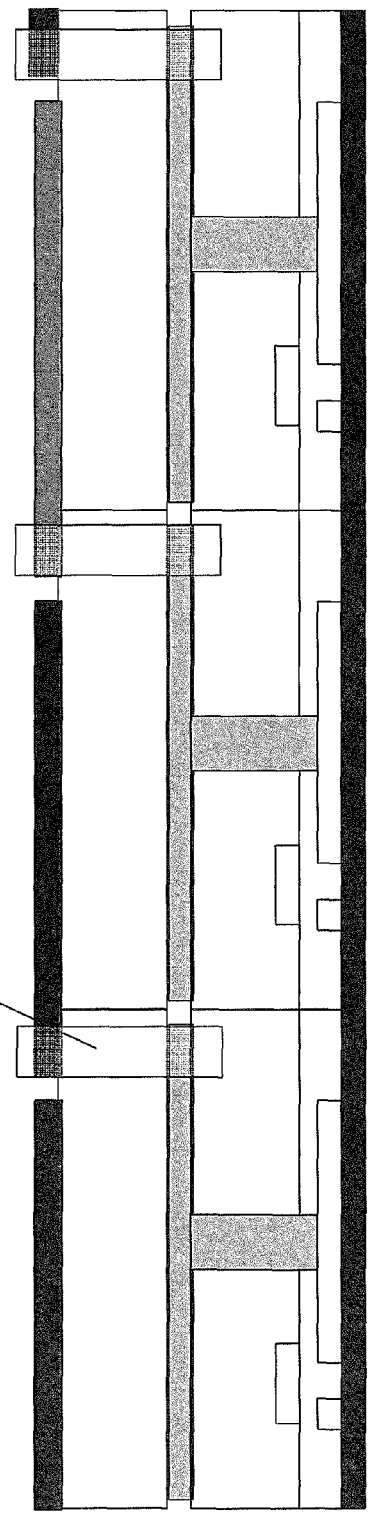
FIG. 3 shows a schematic diagram of a colour display incorporating a backplane with a pixel electrode array, a display medium and a pixilated colour filter on a distorted substrate, wherein the colour filter array has not been aligned with respect to the underlying pixel electrode array.

FIG. 3 shows a distorted substrate where the position of the top pixel electrode has been aligned accurately with respect to the source/drain/gate pattern of the TFT. If the TFT array is distorted due to distortion of the dimensionally unstable substrate during processing, and the colour filter array is patterned on a periodic array according to the method in the prior art the colour filter of a particular pixel is deposited partly over the top pixel electrode of a neighbouring device leading to overlap areas 12 and associated image artefacts.

Figure 4:
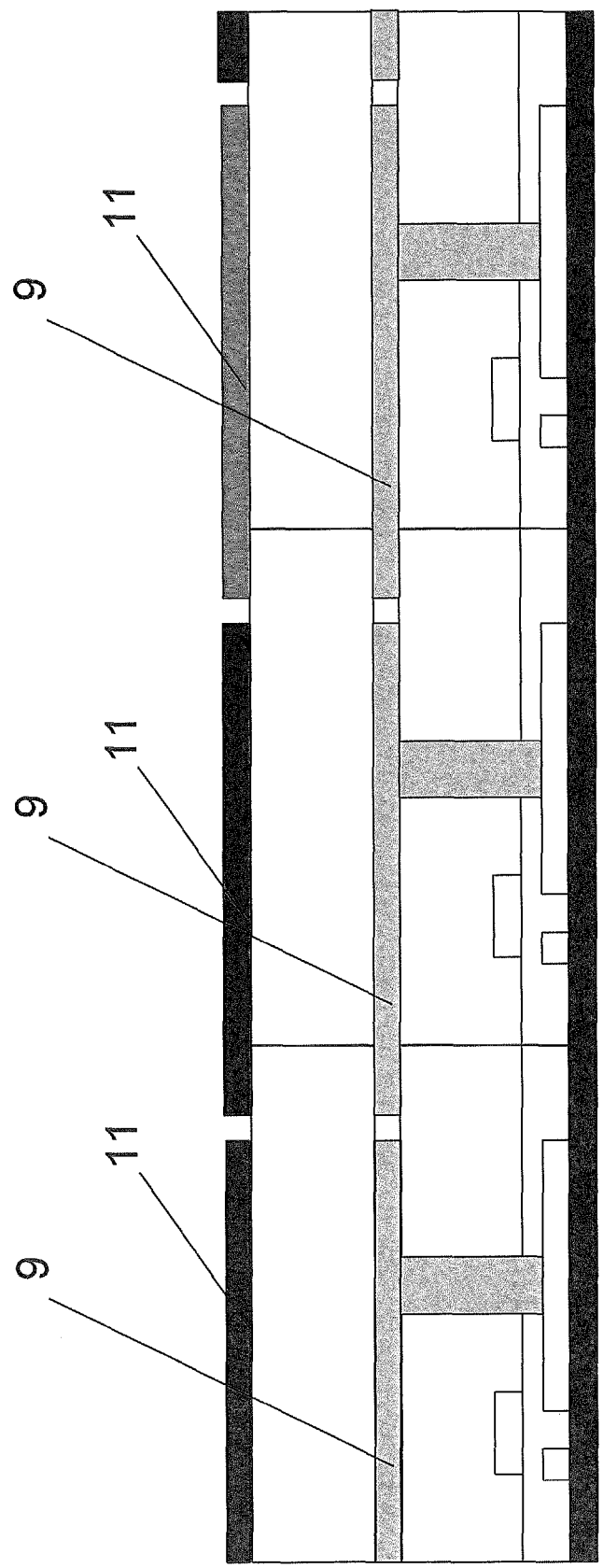
FIG. 4 shows a schematic diagram of a colour display incorporating a backplane with a pixel electrode array, a display medium and a pixilated colour filter on a distorted substrate, wherein the colour filter array has been aligned with respect to the underlying pixel electrode array according to the present invention.

In contrast, the effect of employing the present invention is illustrated in FIG. 4. It can be seen that the top pixel electrode in FIG. 4 has been intentionally misaligned with respect to the source/drain/gate pattern of the TFT array. For example, the array of pixel electrodes is defined on a regular, periodic or quasi-periodic grid irrespective of the distortion of the underlying TFT array. The colour filters are then aligned to the top pixel, by patterning the colour filter array on the same regular, periodic or quasi-periodic grid, therefore enabling the colour filter and the top pixel electrode to be exactly aligned to each other.

Figure 5:
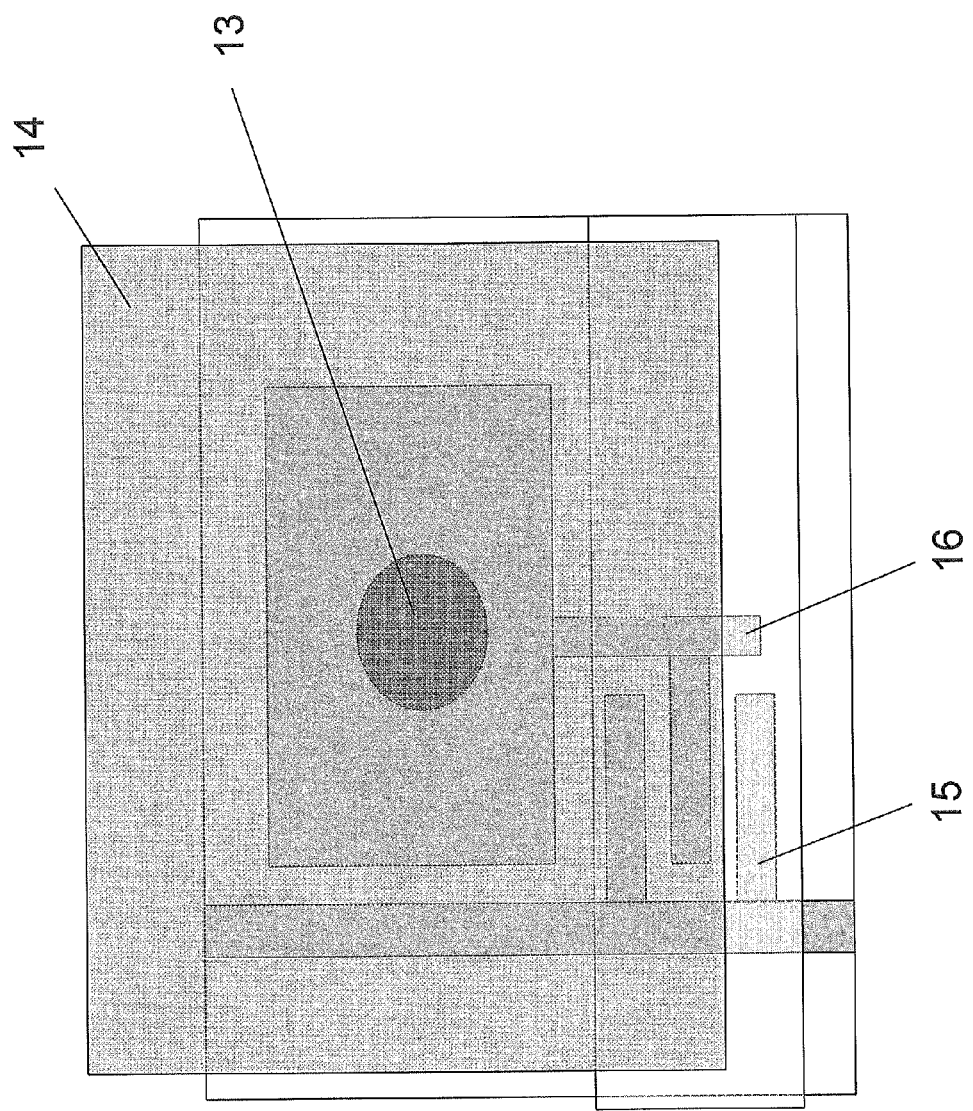
FIG. 5 shows a top view of an electronic device incorporating a top pixel electrode and a colour filter on an undistorted substrate that is correctly aligned according to the present invention.

A top view of the device is seen in FIG. 5 showing the overlying top pixel electrode 14 and the via hole 13 that electrically connects the top pixel electrode to the underlying drain pad 16 of the TFT (with source electrode 15).

Figure 6:
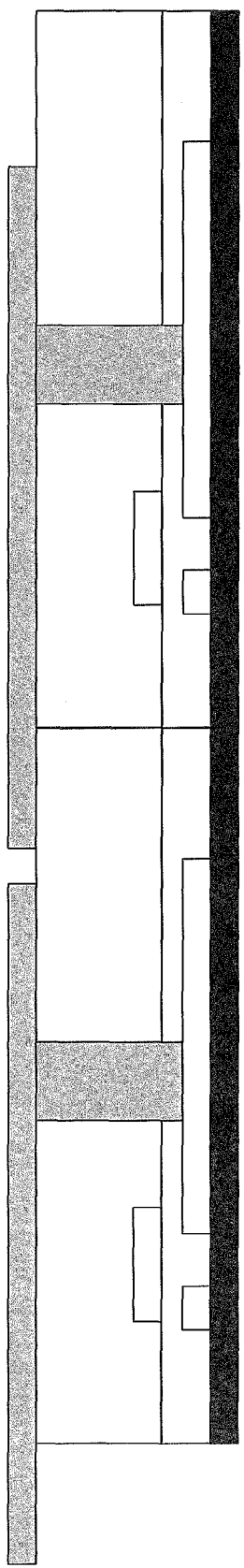
FIG. 6 shows an electronic device incorporating a top pixel electrode deposited onto a distorted substrate that is intentionally misaligned.

As can be seen in FIG. 6, as a result of the various preceding processing stages, a flexible substrate will suffer from distortion. In order to accommodate a flexible substrate, the top pixel pattern is able to be distortion corrected to align with the source and drain pattern on the substrate. This would result in a distorted top pixel pattern and make alignment with a pixilated colour filter impossible. The top pixel electrode layer is deposited such that it is mis-aligned in relation to the underlying elements of the device. However, mis-alignment of the top pixel electrode to the underlying device elements will not affect the performance of the device in itself. It will lead to variations of the position the via-hole interconnect 13 within the pixel electrode 14, however, this does not affect device performance as long as the distortion of the TFT array is sufficiently small that the via-hole remains within the area of the respective pixel electrode without connecting to a neighbouring pixel electrode. It is desirable for good device performance that the overlying colour filter of the device is aligned to the top pixel electrode. Therefore, after the deposition of the display media, the positioning of the top pixel electrode is remembered and stored and the overlying colour filter is aligned to the position of the pixel electrode. The result will be that both the top pixel electrode and the colour filter will be mis-aligned in relation to the underlying features of the device, but this will not affect the performance of the device.

Figure 7:
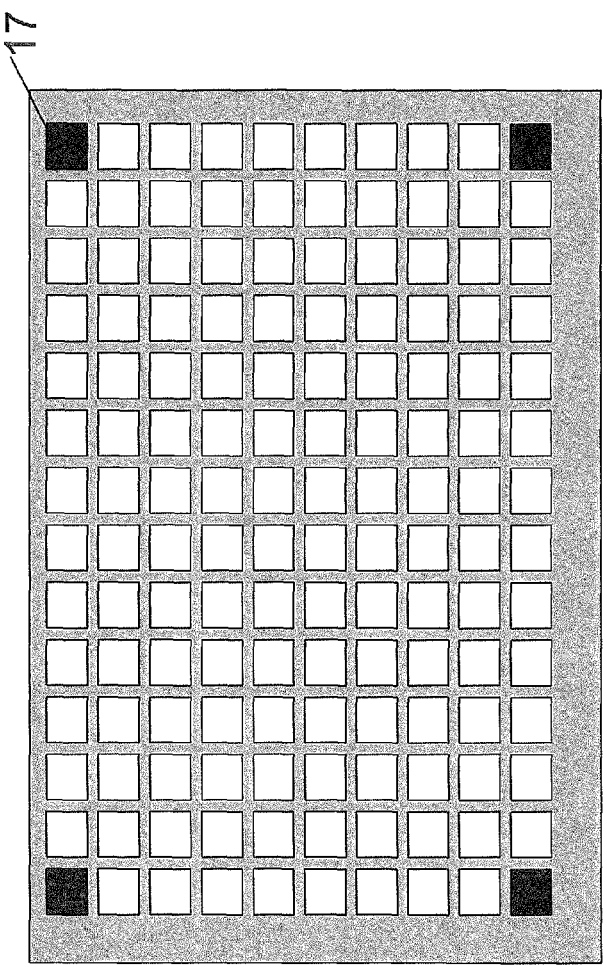
FIG. 7 show the substrate markers on the edge of the substrate.

The alignment of the colour filter to the top pixel electrode may be achieved in a number of ways. The data representing the positioning of the top pixel electrode may be stored and then used to self-align the overlying colour filter to the top pixel electrode. Alternatively, the substrate markers may be used to locate the position of the top pixel electrode and then used to self-aligned the colour filter to it, as is shown in FIG. 7, with the substrate markers 17 located at each corner of the substrate.

If the array of pixel electrodes and colour filters were aligned to be at a fixed position with respect to each of the TFTs, as is the case in conventional configuration in which the pixel electrode is defined on the same level as the source-drain and gate electrodes, respectively, this would lead to visual image artefacts, since the human eye is very sensitive to spatial variations in the pitch of a quasi-periodic array. Also, any misalignment of the pixel electrode and the colour filter pixel can lead to image artefacts such as colour filters spatially overlapping with pixel electrodes belonging to neighbouring pixels/sub-pixels.

The architecture according to the present invention addresses this problem by allowing to vary the position of the pixel TFT with respect to the pixel electrode and colour filter, respectively. By forming the pixel electrode on a different level of the device than the TFTs the present invention allows maintaining accurate alignment of the source-drain and gate electrodes of the TFT with respect to each other in the presence of substrate distortions while forming the pixel electrodes and colour filter pixels on a periodic or quasi-periodic array with high accuracy and in accurate relative alignment.

Figure 8:
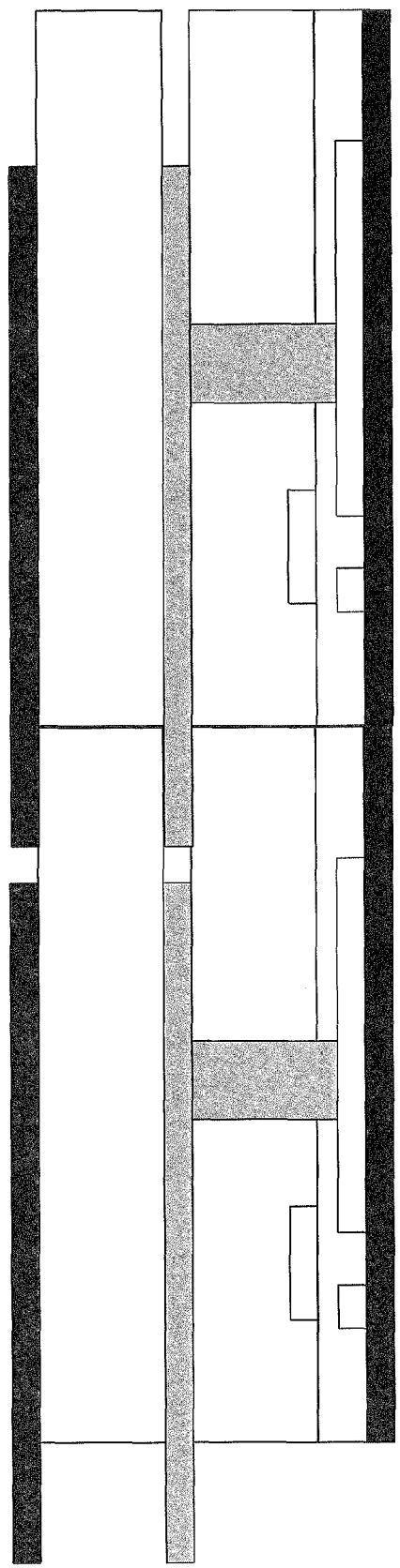
FIG. 8 illustrates an electronic device incorporating a top pixel electrode deposited onto a distorted substrate where the colour filter has been aligned to the top pixel electrode.

FIG. 8 shows a device structure where a colour filter has been self-aligned to the underlying pixel electrode.

In the example discussed within the first embodiment, where the top pixel electrode is not aligned such as to be at a fixed position with respect to the TFT, there is a maximum level of distortion that can be tolerated by simply using a periodic step and repeat patterning process to define the top pixel electrode pattern.

The maximum allowable distortion for periodic patterning is defined by the diameter of the via and the dimensions of the pixel. As long as the distortion does not cause the via to move outside the perimeter of the pixel electrode, then the top pixel electrode pattern can be defined by a simple step and repeat patterning technique where the pixel pattern is translated by an integer multiple of the pixel dimension.

Figure 9:
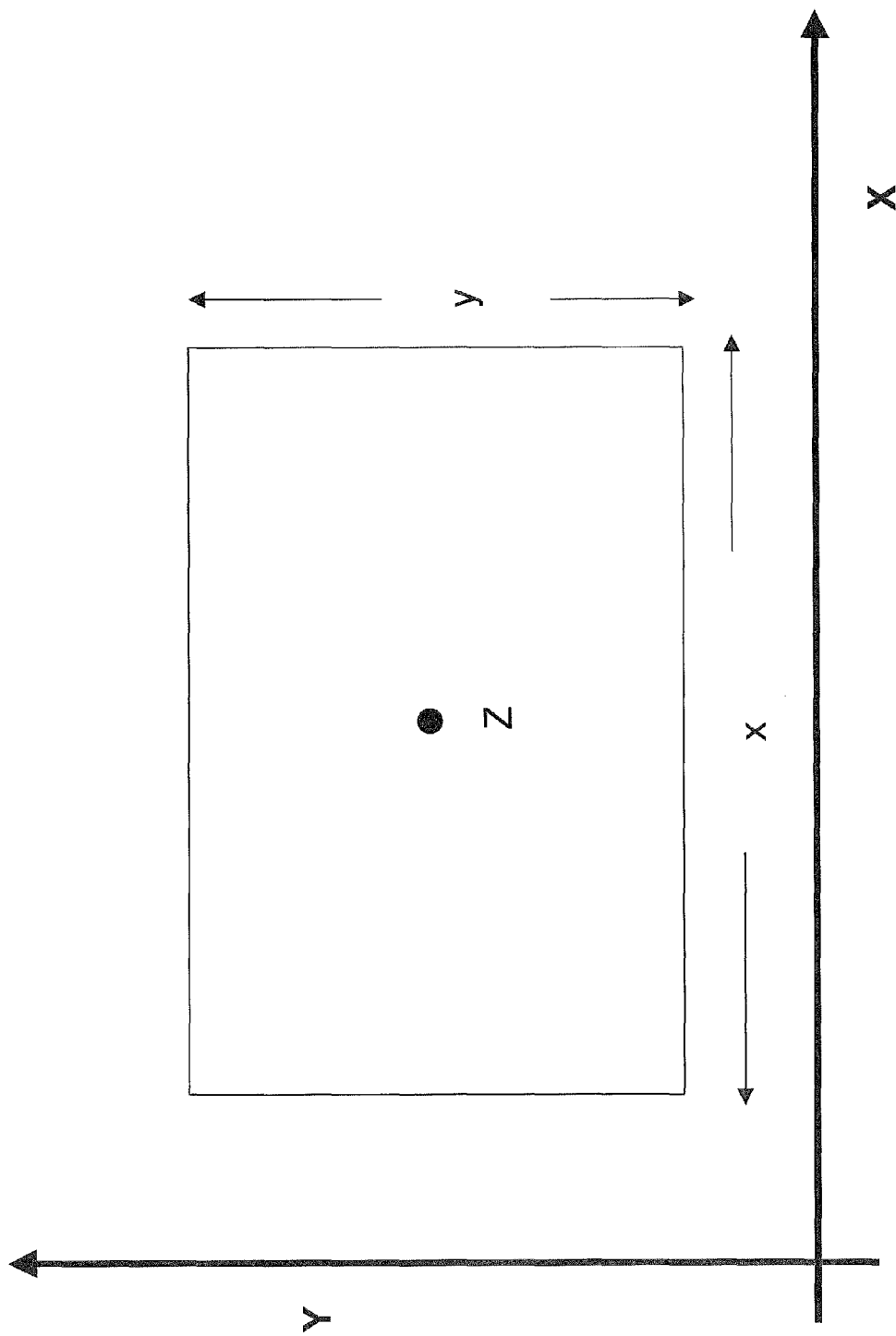
FIG. 9 shows the level of tolerable distortion for both a via hole from the centre of a top pixel and also of a pixel electrode on a substrate surface.

This is further explained graphically in FIG. 9, where the pixel has the dimensions x and y, and the via diameter is Z. The position of the via is held at a fixed position relative to the TFT (which is actually moving due to distortion), and the top pixel electrode pattern is allowed to remain static. This technique works well as long as the maximum distortion on the active area is less that $(Z-x)/2$ in the x direction and $(Z-y)/2$ in the y direction. The top pixel pattern in this case can be defined as a regularly repeating periodic pattern.

Preferably, the patterning of the pixel electrode and colour filter array involve exposing the substrate to a periodic pattern of light with a defined pixel pitch and translating the substrate between subsequent exposures by a fixed translation distance that is an integer multiple of said pixel pitch. The step-and-repeat exposure might involve photolithographic patterning or laser ablation of the pixel electrode and colour filter materials. Preferably, for the patterning of the pixel electrodes and of the colour filter pixels the same pixel pitch and the same fixed translation distance which is an integer multiple of the pixel pitch are used. The pattern of colour filter pixels is preferably aligned with respect to the pattern of pixel electrodes by using a set of global alignment marks defined on the level of the pixel electrodes.

As soon as the distortion is greater than this maximum distortion value, the via will be connecting to more than one top pixel electrode.

In this case, where the maximum distortion is greater than $(Z-x)/2$ in the x direction or $(Z-y)/2$ in the y direction, a simple periodic repeating pattern will not allow for each pixel on the display to make contact through only a single via. Therefore, local alignment must be employed and the top pixel pattern must be adjusted across the display to accommodate this. The result is a non-periodic pattern. Local distortion correction is the only method that will be successful in defining the top pixel and colour filter pattern such that each sub-pixel is correctly aligned. However, even in this case the deviations of the colour filter array from a perfectly periodic array can be kept to a minimum by allowing the position of the via hole interconnect to vary within the area of the pixel electrode.

Preferably, the patterning of the pixel electrode and colour filter array involve a step-and-repeat exposure which exposes the substrate to a pattern of light in an exposure area and translates the substrate between subsequent exposures by a variable distance that is selected to ensure that in each of the exposed areas each via-hole interconnection remains connected to the correct sub-pixel electrode.

The pattern of each step-and-repeat light exposure is preferably periodic and the correction for the distortion of the array of TFTs may be achieved solely by varying the translation distance by which the substrate is translated in between subsequent exposures for patterning of the pixel electrodes. Preferably, for the patterning of the pixel electrodes and of the colour filter pixels the same pixel pitch and the same set of translation distances are used. The pattern of colour filter pixels is preferably aligned with respect to the pattern of pixel electrodes by using a set of global alignment marks defined on the level of the pixel electrodes.

According to another embodiment of this aspect of the invention the pattern of each step-and-repeat light exposure is non-periodic and the correction for the distortion of the array of TFTs is achieved by varying the distance by which the substrate is translated in between subsequent exposures, and by selecting a set of variable pixel distances in each step-and-repeat light exposure pattern in such a way that visual image artefacts at the boundaries between subsequent light-exposures are minimized. Preferably, for the patterning of the pixel electrodes and of the colour filter pixels the same set of pixel distances and translation distances are used. The pattern of colour filter pixels is preferably aligned with respect to the pattern of pixel electrodes by using a set of global alignment marks defined on the level of the pixel electrodes.

The patterning of the colour filter array may consist of three or more individual patterning steps, and the above applies to each of the three or more patterning steps.

For the patterning of the pixel electrodes and colour filter array techniques other than step-and-repeat light exposure, such as direct printing, conventional photolithography, imprinting or any other patterning technique may be used.

For the TFT, configurations other than top-gate architectures might be used, such as bottom-gate TFT structure with the pixel electrode being located on a level different from that on which the source and drain electrodes are formed. The invention also applies to passive matrix displays in which the pixel electrode and colour filter arrays need to be formed on top of an array of addressing interconnects.

The present invention is not limited to the foregoing examples. Aspects of the present invention include all novel and inventive aspects of the concepts described herein and all novel and inventive combinations of the features described herein.

For the semiconducting layer any vacuum or solution processable conjugated polymeric or oligomeric material that exhibits adequate field-effect mobilities exceeding $10{-}3$ cm2/Vs, preferably exceeding $10{-}2$ cm2/Vs, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic semiconductor nano-wires (X. Duan, Nature 425, 274 (2003)).

The structures described above could be supplemented by other conductive and/or semiconductive structures on the same substrate, for example interconnects. Multiple structures as described above may be formed on the same substrate, and may be connected together by electrically conductive interconnects to form an integrated circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A pixel architecture for compensating for distortions in a flexible substrate of a flexible display, comprising:
   a first layer comprising a plurality of thin film transistors arranged in a first array on a flexible substrate;
   a second layer disposed above said first layer comprising a plurality of pixel electrodes arranged in a second array such that each of said plurality of pixels is coupled to a respective thin film transistor in said first array for receiving a signal from said respective thin film transistor; and
   a third layer comprising a plurality of colour filters arranged in a third array with each colour filter for filtering light displayed by a pixel in said array, wherein said third array has the same pattern as said second array whereby said third layer is aligned to said second layer such that each said colour filter is aligned to said pixel electrode, thereby compensating for distortions in said first array caused by distortions in said flexible substrate.

2. A pixel architecture according to claim 1, wherein each of said pixel electrode is shaped to enable said pixel electrode to be displaced laterally with respect to said thin film transistor during manufacture of said pixel, said displacement being caused by distortions in said flexible substrate.

3. A pixel architecture according to claim 1, wherein each said coupling between said electrode and thin film transistor comprises a via connector between said electrode and said thin film transistor.

4. A pixel architecture according to claim 3, wherein a maximum lateral displacement between each of said coupled electrodes and said thin film transistor is less than half of a difference between a dimension of said electrode and a diameter of said via connector.

5. A pixel architecture according to claim 1, further comprising:
   a display medium disposed between said second and third layers, said display medium being responsive to signals on said pixel electrodes.

6. A pixel architecture according to claim 5 wherein said display medium comprises an electrophoretic display medium.

7. A pixel architecture according to claim 5, wherein said display medium comprises a liquid crystal medium.

8. A pixel architecture according to claim 1, wherein said substrate comprises polyethyleneterephtalate (PET) or polyethylenenaphtalene (PEN).

9. A pixel architecture according to claim 1, wherein said thin film transistor comprises an organic semiconductor.

10. A pixel architecture according to claim 9, wherein said organic semiconductor is a solution-processed organic semiconductor.

11. A flexible display comprising:
    a first layer comprising a plurality of thin film transistors arranged in a first array on a flexible substrate;
    a second layer disposed above said first layer comprising a plurality of pixel electrodes arranged in a second array, each of said pixel electrodes being coupled to a respective thin film transistor for receiving a signal from said respective thin film transistor;
    a display medium for displaying an image, said medium being disposed on said second layer, and said display medium being responsive to signals on said pixel electrodes; and
    a third layer comprising a plurality of colour filters arranged in a third array for filtering an image displayed on said display,
    wherein said third array has the same pattern as said second array whereby said third layer is aligned to said second layer such that each of said colour filters is substantially aligned to a respective pixel electrode, and wherein at least some of said pixel electrodes and colour filters are misaligned with said thin film transistor, thereby compensating for distortions in said first layer caused by distortions in said flexible substrate.

12. A flexible display according to claim 11 wherein each of said pixel electrodes is shaped to enable said pixel electrodes to be displaced laterally with respect to said thin film transistors during manufacture of said display, said displacement being caused by distortions in said flexible substrate.

13. A flexible display according to claim 11, wherein said coupling between a said pixel electrode and a said respective thin film transistor comprises a via connector between said electrode and said thin film transistor.

14. A flexible display according to claim 13, wherein a lateral position of said via connector relative to a said pixel electrode varies by at least 5 µm, 10 µm or 20 µm across said array.

15. A flexible display according to claim 14, wherein a maximum lateral displacement between a said electrode and a said thin film transistor is less than half of a difference between a dimension of said electrode and a diameter of said via connector.

16. A flexible display according to claim 12, wherein said display medium comprises an electrophoretic display medium.

17. A flexible display according to claim 12 wherein said display medium comprises a liquid crystal display medium.

18. A flexible display according to claim 12, wherein said substrate comprises polyethyleneterephtalate (PET) or polyethylenenaphtalene (PEN).

19. A flexible display according to claim 12, wherein said thin film transistor comprises an organic semiconductor.

20. A flexible display architecture according to claim 19, wherein said organic semiconductor is a solution-processed organic semiconductor.

21. A method of compensating for distortion when manufacturing a pixel for a display, the pixel comprising: a first layer comprising a plurality of thin film transistors arranged in a first array on a flexible substrate; a second layer disposed above said first layer comprising a plurality of pixel electrodes arranged in a second array such that each of said plurality of pixels is coupled to a respective said thin film transistor in said first array for receiving a signal from said respective thin film transistor; and a third layer comprising a plurality of colour filters arranged in a third array for filtering light displayed by said array of pixels, wherein said third array has the same pattern as said second array, the method comprising:

aligning each said filter with each said respective electrode and connecting each said electrode to said thin film transistor so as to allow relative misalignment of said electrode and said thin film transistor.

22. A pixel for a flexible display, comprising:

a first layer comprising a plurality of thin film transistors arranged in a first array on a flexible substrate; and a second layer disposed above said first layer comprising a plurality of pixel electrodes arranged in a second array such that each of said plurality of pixel electrodes is coupled to a respective thin film transistor in said first array for receiving a signal from said respective thin film transistor, wherein each of said pixel electrodes is shaped to enable each pixel electrode to be displaced laterally with respect to said respective thin film transistor during manufacture of said pixel, said displacement being caused by distortions in said flexible substrate.

23. A pixel according to claim 22, wherein said coupling between each of said electrodes and said respective thin film transistor comprises a via connector between each of said pixel electrodes and said respective thin film transistor.

24. A pixel according to claim 23, wherein a maximum lateral displacement between each of said electrodes and said respective thin film transistor is less than half of a difference between a dimension of said electrode and a diameter of said via connector.

25. A pixel according to claim 22, further comprising:

a third layer comprising a plurality of colour filters arranged in a third array for filtering light displayed by said array of pixels, wherein said third array has the same pattern as said second array whereby said third layer is aligned to said second layer such that each said colour filter is substantially aligned to each said pixel electrode, thereby compensating for distortions in said first array caused by distortions in said flexible substrate.

26. A pixel according to claim 22, further comprising:

a display medium disposed between said second and third layers, said display medium being responsive to signals on said pixel electrode.

27. A pixel according to claim 26 wherein said display medium comprises an electrophoretic display medium.

28. A pixel according to claim 26, wherein said display medium comprises a liquid crystal medium.

29. A pixel according to claim 22, wherein said substrate comprises polyethyleneterephtalate (PET) or polyethylenenaphtalene (PEN).

30. A pixel according to claim 22, wherein said thin film transistor comprises an organic semiconductor.

31. A pixel according to claim 30, wherein said organic semiconductor is a solution-processed organic semiconductor.

* * * * *